United States Patent [19]
Chandra et al.

[11] Patent Number: 6,036,770
[45] Date of Patent: Mar. 14, 2000

[54] METHOD OF FABRICATING A LATERALLY CONTINUOUSLY GRADED MERCURY CADMIUM TELLURIDE LAYER

[75] Inventors: Dipankar Chandra, Richardson; Donald F. Weirauch, Dallas; Thomas C. Penn, Richardson, all of Tex.

[73] Assignee: Raytheon Company, Lexington, Mass.

[21] Appl. No.: 08/831,813

[22] Filed: Apr. 2, 1997

Related U.S. Application Data

[60] Provisional application No. 60/014,825, Apr. 4, 1996.

[51] Int. Cl.[7] .................................................. C30B 33/02
[52] U.S. Cl. ...................... 117/2; 117/3; 117/54; 117/957
[58] Field of Search ............................. 117/2, 3, 54, 957

[56] References Cited

U.S. PATENT DOCUMENTS

| | | | |
|---|---|---|---|
| 4,296,324 | 10/1981 | Kern et al. | 250/339 |
| 4,370,557 | 1/1983 | Axmark et al. | 250/554 |
| 4,376,659 | 3/1983 | Castro | 148/1.5 |
| 4,607,272 | 8/1986 | Osbourn | 357/30 |
| 4,639,756 | 1/1987 | Rosbeck et al. | 357/30 |
| 4,691,196 | 9/1987 | Kern et al. | 340/578 |
| 4,769,775 | 9/1988 | Kern et al. | 364/551.01 |
| 4,785,292 | 11/1988 | Kern et al. | 340/578 |
| 4,965,649 | 10/1990 | Zanio et al. | 357/30 |
| 5,049,962 | 9/1991 | Huang et al. | 357/30 |
| 5,192,695 | 3/1993 | Wang et al. | 437/2 |
| 5,302,232 | 4/1994 | Ebe et al. | 156/614 |
| 5,391,882 | 2/1995 | Rhiger | 250/370.13 |
| 5,449,927 | 9/1995 | Hamilton, Jr. et al. | 257/188 |
| 5,459,321 | 10/1995 | Bartoli et al. | 250/370.13 |
| 5,479,018 | 12/1995 | McKee et al. | 250/338.1 |
| 5,510,644 | 4/1996 | Harris et al. | 257/458 |
| 5,559,336 | 9/1996 | Kosai et al. | 250/370.13 |
| 5,581,117 | 12/1996 | Kawano | 257/627 |
| 5,633,527 | 5/1997 | Lear | 257/432 |
| 5,861,626 | 1/1999 | Chandra et al. | 250/338.4 |

OTHER PUBLICATIONS

T. Tung *Journal of Crystal Growth*, (Netherlands), vol. 86, pp. 161–72 (1988).

*Primary Examiner*—Robert Kunemund
*Attorney, Agent, or Firm*—Baker & Botts, L.L.P.

[57] ABSTRACT

Methods are described for the depositing of a plurality of films, preferably mercury cadmium telluride (HgCdTe), whose compositions vary in a controlled manner to provide unique infrared spectral absorption and detection properties. HgCdTe films 64 and 70 are deposited on opposite sides of electrically insulating, IR transmissive film 42. Initially these HgCdTe films may be of uniform composition laterally from 62 to 66 and 68 to 72. However the interdiffusion and segregation coefficients of Hg and Cd are different and vary differently with respect to temperature. By placing film 70 in contact with heater 9, a controlled lateral gradient in composition of the film may be effected because 44 is hotter than 45 and will produce higher Cd concentration at 68 than 72. Similarly 62 will be higher in Cd than 66, however, the gradient will be much less because 64 is cooler than 70. Through the use of a heater 60, the lateral compositional gradient of 64 may be varied with respect to film 70. The close tracking of the IR properties of 70 and 64 can provide useful and novel integrated IR devices such as multiple band spectrometers.

23 Claims, 6 Drawing Sheets

METHOD OF FABRICATING A LATERALLY CONTINUOUSLY GRADED MERCURY CADMIUM TELLURIDE LAYER

CROSS-REFERENCE TO COMMONLY-OWNED, CO-FILED, RELATED APPLICATIONS

The following are commonly-owned, co-filed, related applications, and are incorporated by reference herein; "NARROW BAND INFRARED FILTER DETECTORS" Ser. No. 08/831,103; "MERCURY CADMIUM TELLURIDE INFRARED FILTERS AND DETECTORS AND METHODS OF FABRICATION" Ser. No. 08/831,170; "MERCURY CADMIUM TELLURIDE DEVICES FOR DETECTING AND CONTROLLING OPEN FLAMES" Ser. No. 08/834,791; "UNCOOLED MERCURY CADMIUM TELLURIDE INFRARED DEVICES WITH INTEGRAL OPTICAL ELEMENTS" Ser. No. 08/834,790; "UNCOOLED INFRARED SENSORS FOR THE DETECTION AND IDENTIFICATION OF CHEMICAL PRODUCTS OF COMBUSTION" Ser. No. 08/831,101; "INTEGRATED IR DETECTOR SYSTEM" Ser. No. 08/831,815; and "NARROW BAND INFRARED FILTER-DETECTORS" Ser. No. 08/831,814.

This application claims priority under 35 USC 119(e)(1) of provisional application 60/014,825 filed Apr. 4, 1996.

FIELD OF THE INVENTION

This invention generally relates to devices for the detection of infrared (IR) radiation (e.g. of flames to signal hazardous conditions, or to control of manufacturing processes or to perform spectral analysis) and, more specifically, to the design and fabrication of such devices.

BACKGROUND OF THE INVENTION

When materials burn or explode, emission of light in the visible as well as the invisible infrared (IR) and ultraviolet (UV) wavelengths occur. The chemical composition of the burning flame determines the wavelengths of light emitted. These emissions can be detected by various photosensitive devices for safety, process control or spectroscopic purposes.

Fire detection systems which furnish an electrical output signal in response to a sudden flame or explosion are well known. Such systems are available on the open market, but are high cost items. One of the reasons for this high cost has been the low sensitivity from available detectors as well as the high cost of detector manufacture. The low sensitivity results in low signal to noise ratio of the system which causes a high rate of false alarms. To circumvent the problem of false alarms, the use of individual detectors having different spectral responses has been taught by Kern, et al (see Kern et al. U.S. Pat. No. 4,296,324 entitled "DUAL SPECTRUM INFRARED FIRE SENSOR", issued Oct. 20, 1981; No. 4,691,196 entitled "DUAL SPECTRUM FREQUENCY RESPONDING FIRE SENSOR", issued Sep. 1, 1987; No. 4,769,775 entitled "MICROPROCESSOR-CONTROLLED FIRE SENSOR", issued Sep. 6, 1988; and No. 4,785,292 entitled "DUAL SPECTRUM FREQUENCY RESPONDING FIRE SENSOR", issued Nov. 15, 1988). In addition, intensity comparisons have been made between UV and IR wavelengths to further reduce false alarms. Complex microprocessor logic has been employed to analyze the flicker frequency of the radiation to distinguish a flame from background IR emission.

Axmark, et al (see Axmark et. al. U.S. Pat. No. 4,370,557 entitled "DUAL DETECTOR FLAME SENSOR" issued Jan. 25, 1983) teaches a system using dual, individual, dissimilar detectors for the control of a multi-burner boiler or industrial furnace installation. The detectors used in Axmark were a silicon (Si) detector responsive to visible light and an IR responsive lead-sulfide (PbS) detector with emphasis on the use of both the direct current (dc) and alternating current (ac) responses of these detectors.

In medical research and chemical analysis, IR spectroscopy is often useful. Instruments to perform this type of analysis typically cost $10,000.00 in 1994 US dollars.

Military applications are another expensive use of IR detection systems. Such systems are generally used for IR imaging similar to radar or for the guidance of heat seeking missiles. Although many different materials are used for these detectors, one of these is mercury-cadmium-telluride, HgCdTe, hereafter referred to as MCT. MCT detectors are cooled well below atmospheric temperatures, typically 77° Kelvin, to accomplish detectivity of targets near atmospheric temperature.

SUMMARY OF THE INVENTION

The present invention relates to the growth, preparation and application of thin films of MCT as IR filters and detectors in an uncooled environment for detection, control and analysis.

One of the physical attributes that makes MCT so favorable as an IR filter and/or detector is that a thin film of MCT exhibits a significant change of electrical conductivity when exposed to certain wavelengths of IR radiation. Another important attribute of MCT is that the IR transmission and electrical conductance properties versus IR wavelength may be controlled by the ratio of Hg to Cd in the MCT film. At shorter IR wavelengths than chosen for the fabricated film composition, IR radiation will be greatly attenuated at the same time the electrical conductance will be significantly increased. With little attenuation, the MCT film transmits IR radiation at longer wavelengths than the wavelengths which cause the film conductivity to change.

These useful physical attributes have been applied to several embodiments described, e.g., in the aforementioned co-filed applications, (docket #'s TI-16934 and 18252). Many of those previous embodiments utilize controlling the composition of MCT during film deposition to obtain the desired IR spectral selectivity. This was often achieved by a controlled change of MCT composition through the thickness of the MCT film. While several methods of epitaxial film growth exists, it is known that liquid phase epitaxial growth (LPE) in a Hg rich environment provides superior films to other methods, (refer to T. Ting, *Journal of Crystal Growth*, (Netherlands), vol. 86, pp 161–172, [1988].) This invention describes several novel embodiments for achieving a controlled compositional gradient through the thickness of the film during and after film growth.

Other embodiments show how this lateral compositional gradient may be achieved more directly by means of post deposition heat treatment in an environment with a controlled lateral temperature gradient. This latter method also provides a family of novel IR filters having sharply tuned wavelength responses which are not achievable by other methods.

For composite active elements, such as silicon (Si) integrated circuits combined with MCT IR filters and/or detectors, the lattice mismatch between Si and MCT is so large that epitaxial growth of either on the other is impossible. Methods are shown whereby suitable intermediary layers provide a novel material structure that allows the combination of active elements using either or both gallium arsenide (GaAs) and Si with MCT films.

In some embodiments, methods are shown for modifying the IR properties of a HgCdTe film whose initial Hg to Cd composition is uniform. Through the use of a heater that provides a lateral gradient in temperature to the original HgCdTe film, a lateral continuous compositional gradient is produced. In some embodiments, a controlled atmosphere, preferably Hg rich, may be provided while heating the film nonuniformly. The Hg rich atmosphere may preferably be concentrated on the cooler or hotter portion of the film being heat treated to produce the desired gradient in composition of the HgCdTe film.

In some embodiments a uniform HgCdTe film may be placed between a Cd-rich film and a Hg-rich film to effect the graded HgCdTe film composition. In some embodiments the Cd-rich film is preferably CdTe and the Hg rich film is preferably HgTe. In some embodiments it is desirable to remove the Cd-rich and/or Hg-rich films from the final structure.

In some embodiments a Cd depleted film is adjacent to the HgCdTe film such that the ratio of Hg to Cd is lower in the cooler portion of the HgCdTe film than the hotter portion.

In some embodiments the Cd rich substrate is preferably CdTe and the continuously graded HgCdTe film is grown on one side and the HgCdTe detector layer is grown on the opposite side, preferably by means of liquid phase epitaxy.

In some embodiments at three or more films are grown sequentially with one of the films etched to provide at least two sensors. These sensors are electrically insulated from the other films by an electrically insulating, IR transmissive film preferably CdTe, such that the other HgCdTe film(s) act as IR spectral filters between the IR source and the detector film. A lateral compositional gradient in these films is effected by nonuniform heating of the ensemble preferably in a controlled atmosphere.

In some embodiment, the detector layer as well as the filter layers have a lateral compositional gradient which is preferably produced by heat treatment with a graded source of heat.

The graded source of heat in some embodiments is produced by rapid thermal annealing lamps in conjunction with reflective masks to provide a pattern of non uniform heating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

This description of the preferred embodiments of the present invention is aided by referral to FIGS. 1–9 and Tables 1–5. In the sketches showing MCT films, the thickness and wedge tapers are greatly exaggerated and the scales are neither absolute nor relative.

Figure 1:
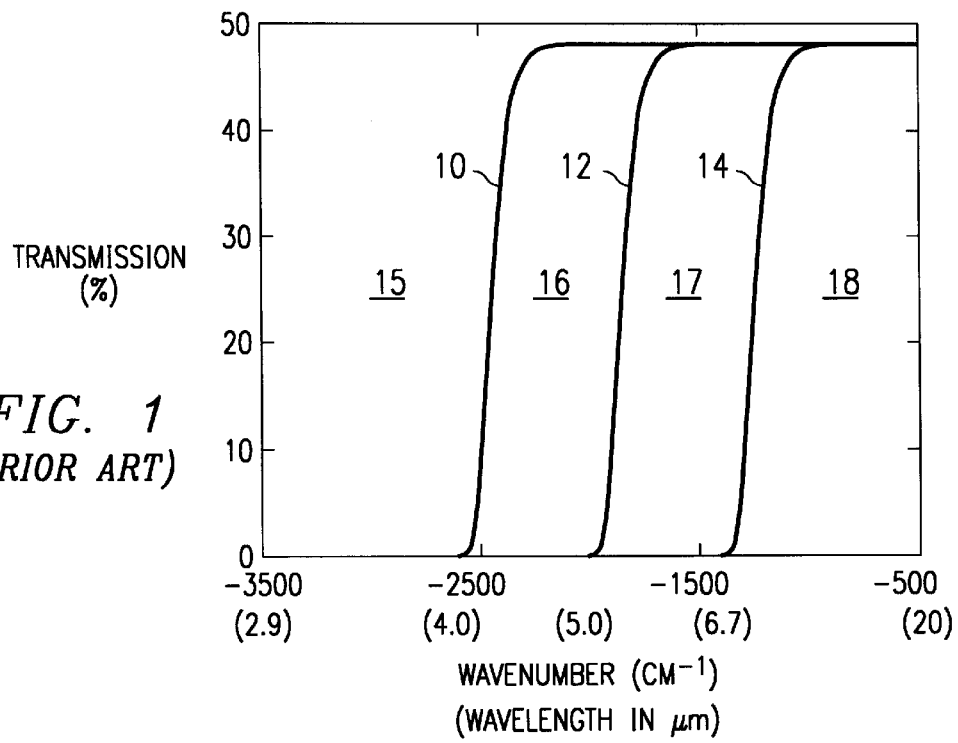
FIG. 1 shows a graph of IR film properties versus MCT film composition (prior art.)

FIG. 1 is a graph of a model of the IR transmission (%) versus wavenumber ($cm^{-1}$) for the MCT film composition $(Hg_{(1-x)}Cd_x)Te$. The IR wavelength in mm is $-10^4$ divided by the wavenumber. For graph 10, x=0.3. For graph 12, x=0.25. For graph 14, x=0.2. The abscissa of the graph runs from a wavenumber of –3500 (corresponding to a wavelength of 2.9 mm) to a wavenumber of –500 (corresponding to a wavelength of 20 mm.) The transmission percentages modeled are illustrative but less than actual because no anti-reflection coatings are assumed. The wavelengths 15 to the left of 10 (4.0 mm and shorter) are absorbed by MCT film 10 and, if electrodes are attached, an increase in conductance of 10 may be detected when emission in the 15 spectral region illuminates the MCT film. Conversely, wavelengths in regions 16, 17 and 18 which are longer than 4.0 mm may be transmitted through film 10 and typically, no change of conductance in 10 occurs when illuminated at wavelengths longer than 4.0 mm within spectral regions 16, 17 and 18. The novel customization of MCT IR detectors for specific wavelengths to be described for the present invention makes use of these physical properties.

Figure 2:
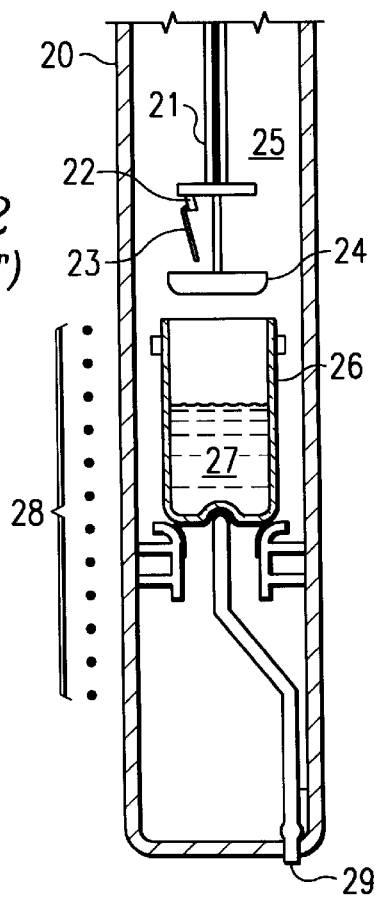
FIG. 2 is a sketch of a liquid phase epitaxial reactor suited to the growth of MCT films in a Hg rich environment (prior art.)

FIG. 2 illustrates the preferred and well known method of epitaxially growing superior MCT films having very low Hg vacancies using a liquid phase epitaxial (LPE) reactor. Table 1 describes the key components and their function.

Figure 3:
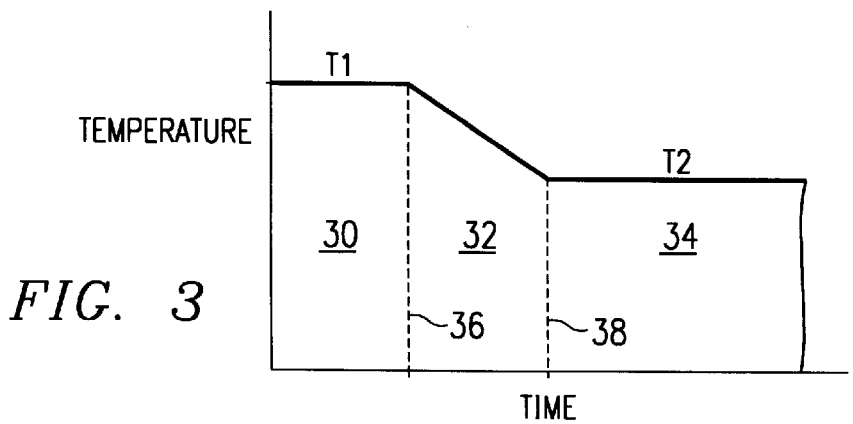
FIG. 3 is an illustration of growth temperature versus time during MCT film deposition to -create a controlled composition versus thickness due the sharp dependence of the segregation coefficient of Cd versus temperature.

The present invention is shown in FIGS. 3–9e. A first embodiment is a method of varying the composition of a $(Hg_{(1-x)}Cd_x)Te$ film during LPE film growth makes use of the strong temperature dependence of the segregation coefficient of Cd in the MCT melt. FIG. 3 illustrates an example of a temperature profile to perform this within the reactor illustrated in FIG. 2. During zone 30 the temperature may be held at T1, for example, 450° C., for a controlled period of time, for example 20 minutes, to time 36. At time 36, the temperature is linearly

TABLE 1

| ID # | Description | Function |
|------|-------------|----------|
| 20 | Process chamber | Seals process environment |
| 21 | Substrate and holder support | Supports and rotates substrate for uniform film deposition. |
| 22 | Substrate holder | Supports substrate during deposition |
| 23 | CdTe or CdZnTe substrate | Provides surface for epitaxially growing MCT. |
| 24 | Stirrer | Agitates HgCdTe melt 27 for controlled deposition on substrate 23 |
| 25 | Hg, Cd, Te vapor | Provides Hg vapor rich environment during growth of MCT film. |
| 26 | Crucible | Container for melt 27 |
| 27 | Melt | Molten HgCdTe source for MCT film deposition. |
| 28 | Chamber Heater | Controls temperature of upper process chamber. |
| 29 | Thermocouple well | Monitors temperature of chamber heater 28. | reduced in zone 32 until time 38, for example 35 minutes from time 36 to time 38. At time 38 the temperature is once more held constant at T2, for example 400° C., during ring zone 34 which continues to the thickness of the film desired. As the temperature is reduced, the proportion of Cd versus Hg in the MCT film increases because of the differences in segregation coefficients in these two components. With the temperature profile sketched in FIG. 3 the value of x in $(Hg_{(1-x)}Cd_x)Te$ is smaller in zone 30 than 34. During zone 32 the content of Cd in the $(Hg_{(1-x)}Cd_x)Te$ film linearly increases. This provides the means of controlling the optical and conductance properties shown in FIG. 1 through the thickness of the MCT film during growth. The MCT film next to the substrate can be either Cd enriched or Cd depleted depending on the temperature profile during film growth.

Figure 4:
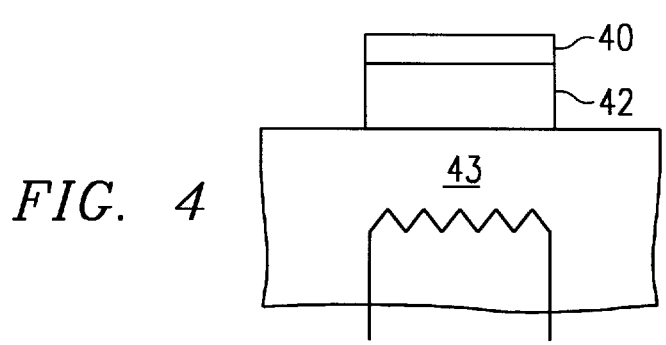
FIG. 4 is a sketch of post deposition treatment of MOT films deposited on Cd bearing substrates whereby the Cd is driven from the substrate to the MOT film by interdiffusion.

A second embodiment of the present invention is a method of providing an MCT film compositional gradient through the film thickness is performed after film growth. This method makes use of the interdiffusion of Cd from the substrate into the MCT film. In FIG. 4 is sketched a diagram of the apparatus. An MCT film 40 has been grown on substrate 42. The IR transparent substrate 42 may be CdTe or cadmium-zinc-telluride (CdZnTe, for example.) The substrate 42 is placed in contact with heater 43 which is at a raised temperature. This causes the Cd in the substrate 42 to interdiffuse into MCT film 40 such that the MCT composition next to the substrate contains more Cd than the surface of 40. The x in $(Hg_{(1-x)}Cd_x)Te$ next to the substrate is larger so the wavelength of IR absorbed or detected at the substrate interface surface is shorter than at the top surface of the film. This is the desirable material profile for through the substrate 42 IR radiation detection because the longer IR wavelengths must pass through the material next to 42 to reach the material at the film surface which is sensitive to longer wavelengths.

Figure 5:
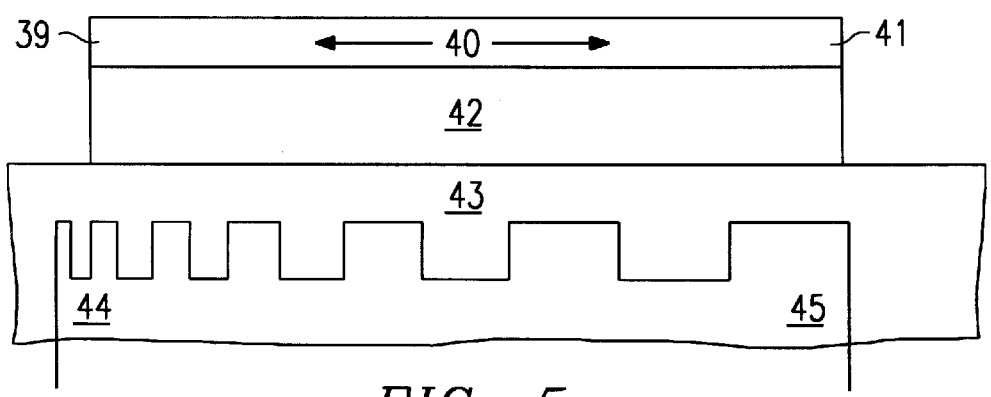
FIG. 5 shows a variant of the technique shown in FIG. 4 whereby very long lateral compositional gradients may be achieved in MCT films.

A third embodiment of the present invention is illustrated in FIG. 5 and Table 2, which

TABLE 2

| ID # | Description | Function |
|------|-------------|----------|
| 39 | Zone of 40 having highest Cd | Provides shortest IR wavelength response |
| 40 | Uniformly deposited MCT film | Controls range of IR response desired |
| 41 | Zone of 40 having lowest Cd | Provides longest IR wavelength response |
| 42 | CdTe or CdZnTe substrate | Provides a substrate with suitable lattice match to MCT for epitaxial growth and is transparent to the range of IR wavelengths desired. |
| 43 | Heater | Provides controlled temperature gradient |
| 44 | Hotter portion of heater 43 | Interdiffuses more Cd per unit time into zone 40 |
| 45 | Cooler portion of heater 43 | Interdiffuses less Cd per unit time into zone 40 | is a method of achieving a lateral variation in MCT film composition. The lateral variation in this embodiment may be quite long, such as 10 cm, if desired, which is achieved by driving Cd into the MCT film from the substrate by interdiffusion. The desired x in a $(Hg_{(1-x)}Cd_x)Te$ film 40 of (typically) uniform composition is grown on IR transparent CdTe or CdZnTe substrate 42 as previously described. This ensemble is placed on heater 43 which has a controlled temperature gradient, for example, where portion 44 is hotter than portion 45. These temperatures are selected for the desired properties of the modified film 40. The heat treated MCT film 40 in zone 39 has a larger x in the $(Hg_{(1-x)}Cd_x)Te$ equation (more Cd) than does that of zone 41; as a result, the modified MCT film 40 will have a gradient of IR response for use in filters and detectors which varies from short wavelengths in zone 39 to longer wavelengths in zone 41 through the lateral dimension of 40. Through the control of the temperature profile during the interdiffusion heat treatment of 40, a physically long dimensioned IR filter/detector may be achieved with any desired spectral response within the IR spectrum.

Figure 6A:
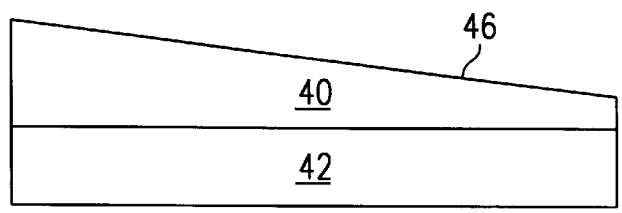
FIG. 6A is a sketch of a continuous MCT film having a compositional gradient in the film thickness direction (produced by any means) which has been lapped with a diamond point turning machine to convert the MCT film to an IR filter which has different wavelength responses in the lateral direction.
Figure 6B:
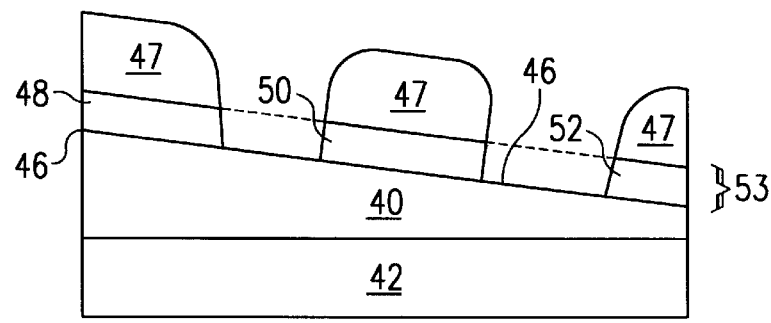
FIG. 6B sketches the formation of MOT detectors over the filter of FIG. 6A by means of conventional photolithography after MOT film deposition.
Figure 6C:
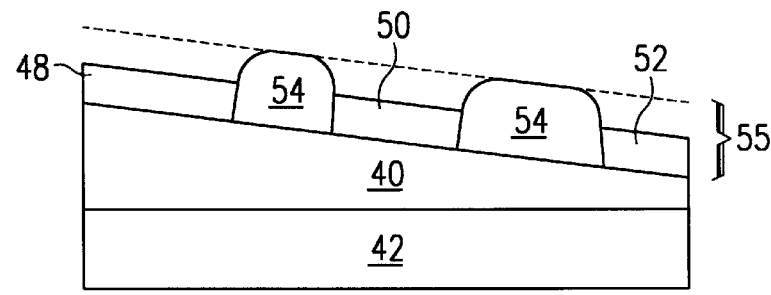
FIG. 6C sketches the formation of MCT detectors over the filter of FIG. 6A through the use of a silicon dioxide mask which is applied and patterned prior to film deposition to inhibit MOT film growth.

Any MCT film having a compositional gradient in the film thickness direction may be converted to a compositional gradient in the lateral direction by lapping the MCT film at a slight angle with respect to the film surface. FIG. 6A shows an exaggerated wedge of MCT film 40 which has been lapped on surface 46 to form a film which has varying wavelength response in the lateral direction. For the purpose of example the MCT film 40 and substrate 42 are the same as described for FIG. 4. A method of delineating detectors having different spectral responses is shown in FIGS. 6B and 6C. In the example of FIG. 6B, a continuous MCT film 53 has been deposited over the lapped surface 46. Photoresist 47 has been placed over film 53 and standard photolithography has been performed to produce detectors 48, 50 and 52, all of which have different bandwidths and spectral centers because of the varying composition through the thickness of MCT film 40.

Another method, shown in FIG. 6C, of creating these same detectors uses a mask to shield areas of MCT film 40 during the LPE growth process. First a continuous silicon dioxide $(SiO_2)$ film 55 is deposited over MOT film 40. This oxide 55 is patterned into a mask by standard lithography to etch holes where the detectors are to be located leaving $SiO_2$ islands 54. Then, the ensemble is placed in an LPE reactor and the MCT material for detectors 48, 50 and 52 is deposited. The SiO$_2$ islands 54 prevents growth of MCT films by acting as an oxide mask.

After either of the detector delineation processes described for FIG. 6B or 6C, detector 48 will detect only the longest wavelengths, over the range of the width of detector 48; detector 50 will detect a wider IR band (because of its wider geometry) at the middle wavelengths; and detector 52 will detect a narrow band of short IR wavelengths.

Figure 7A:
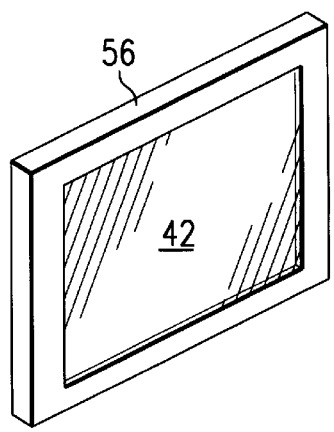
FIG. 7A is a sketch of a substrate holder which allows the simultaneous deposition of MOT films of the same composition on both sides of one or more substrates.

FIG. 7A is a sketch of a substrate holder 56 which holds an IR transparent substrate 42 such that both sides of 42 are exposed to the MCT vapor in the LPE reactor shown in FIG. 2. The rectangular substrate 42 and holder 56 shown is used as a typical example with the understanding that the opening to both 42 sides may be circular, square or any other desired two dimensional geometry and that the holder may be designed for a plurality of substrates rather than just one. A cross sectional view of the substrate 42 after it has been exposed to the MCT vapor is shown in FIG. 7B for MCT films 64 and 70 on substrate 42.

Figure 7B:
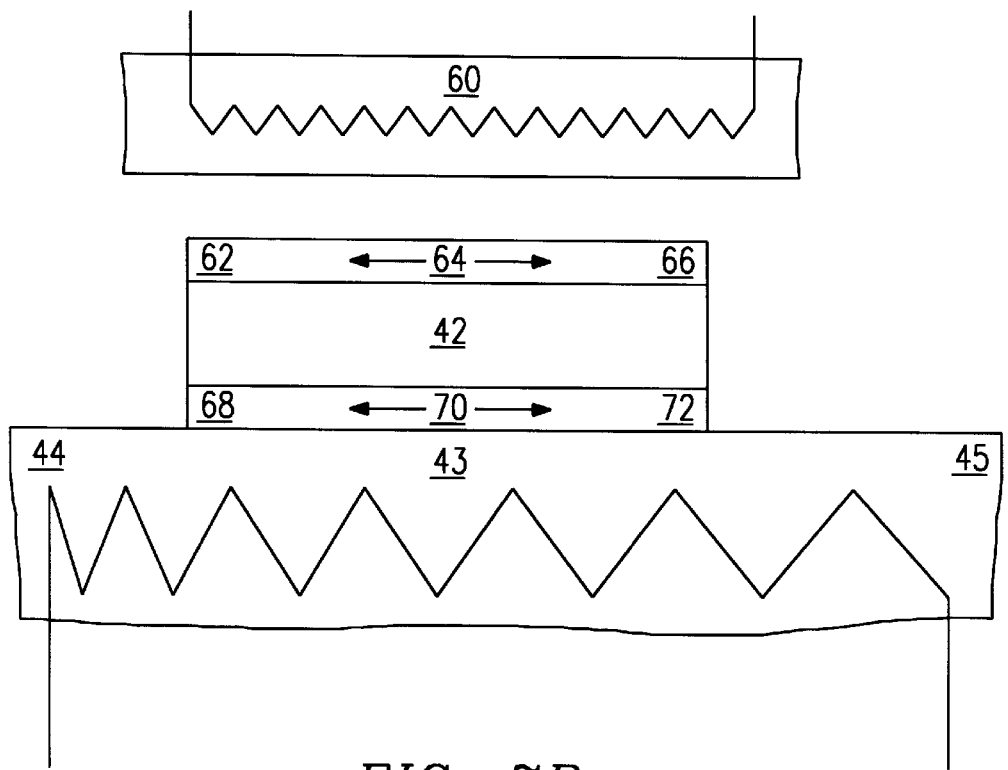
FIG. 7B illustrates the post deposition heat treatment of the double film of FIG. 7A to achieve a very long lateral IR filter having novel response characteristics.

As shown in FIG. 7B and Table 3, a very desirable, novel structure results from

TABLE 3

| ID # | Description | Function |
| --- | --- | --- |
| 60 | Radiant heater | Provides control over difference of annealing temperatures between substrate surfaces. |
| 62 | Hotter zone of MCT film 64 | Results in higher Cd concentration than zone 66 but less than 68. |
| 64 | MCT film of uniform composition | Determines physical properties before heat treatment. |
| 66 | Cooler zone of MCT film 64 | Results in lower Cd concentration than zone 62 and 72. |
| 68 | Hotter zone within MCT film 70 | Results in the highest Cd concentration of any zone in either 64 or 70. |
| 70 | Same as MCT film 64 on the other side of the substrate 42. | |
| 72 | Cooler zone than 68 but hotter than zone 66. | Results in Cd concentration lower than zone 68 but higher than 66. | heat treatment of the two MCT film composite produced when using holder 56. In this case substrate 42 with epitaxial films 64 and 70 having the same MCT composition are placed on heater 43 having a hotter zone 44 and cooler zone 45 as described in FIG. 5. Heater 60 is optional and may either supply a constant temperature or graded temperature surface. In FIG. 7B, heater 60 is shown as a radiant heater and heater 43 is shown as a conduction heater but the choice is governed by the film properties desired. In this example it is assumed that the average temperature is hotter within film 70 than within film 64. Therefore the Cd interdiffusion from substrate 42 will produce a higher concentration of Cd within zone 68 than 62 directly above it. The lateral direction in both MCT films 64 and 70 contain a gradient of decreasing Cd from zone 62 to 66 and zone 68 to 72, respectively. The IR properties within zone 68 attenuates or detects shorter wavelengths than the MCT material 62 directly opposite it through IR transparent substrate 42. Through the vertical direction of the two films this results in a narrow band of IR spectrum characteristics with zone 68 attenuating the shorter wavelengths, but passing higher wavelengths to be detected/filtered by zone 62 at only a slightly higher wavelength than zone 68 blocks. Although described for the hotter temperature treated films in zones 62 and 68, this same narrow spectral response at varying center wavelengths exists across the entire lateral dimensions of the films.

Figure 8:
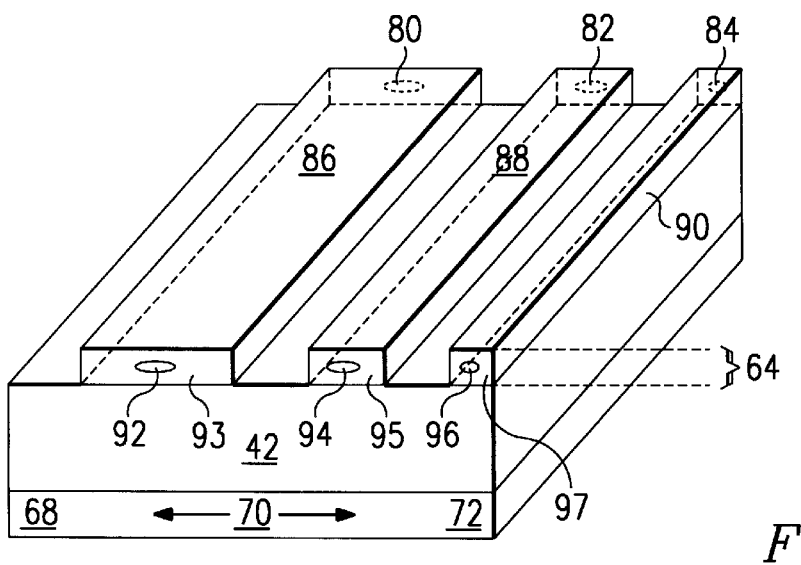
FIG. 8 is a sketch illustrating the patterning of one of the heat treated double MCT films of FIG. 7A into discrete IR detectors which are displaced laterally at the chosen wavelengths with a width selected for the desired bandwidth.

The sketch of the device shown in FIG. 8 and described in Table 4 is an indication

TABLE 4

| ID # | Description | Function |
| --- | --- | --- |
| 42 | CdTe or CdZnTe substrate | Provide a substrate with suitable lattice match to MCT for epitaxial growth and be transparent to the range of IR wavelengths desired. |
| 64 | Heat treated MCT film as described in FIG. 7B | Achieve IR response related to MCT film 70. |
| 68 | Highest Cd composition of 70. | Attenuate lower and pass higher wavelengths of IR spectrum. |
| 70 | Heat treated MCT film as described in FIG. 7B | Achieve IR response related to MCT film 68. |
| 72 | Lowest Cd composition of 70. | Attenuate longer IR wavelengths but pass those which will be detected immediately above by detector 90. |
| 86 | Detectors; | Patterned portions of film 64 Form wideband IR detector for shorter IR wavelengths. |
| 80, 92, 93 | Electrical contacts to detector 86 | Forms electrical connection for external electronics to detect changes of conductance of 86 with IR radiation. |
| 88 | Patterned portion of film 64 | Form medium bandwidth IR detector at medium wavelengths of IR spectrum. |
| 82, 94, 95 | Electrical contacts to detector 88 | Forms electrical connection for external electronics to detect changes of conductance of 88 with IR radiation. |
| 90 | Patterned portion of film 64 | Form very narrow bandwidth, long wavelength IR detector. |
| 84, 96, 97 | Electrical contacts to detector 90 | Forms electrical connection for external electronics to detect changes of conductance of 90 with IR radiation. |
| 98 | Incident IR radiation | | of the wide utility that may be obtained from the fabrication methods shown in FIGS. 7A and B.

MCT films 64 and 70 are LPE deposited and heat treated as described in FIG. 7 such that a point lying on MCT film 64 has slightly less Cd than the same lateral location on 70. Film 64 is patterned into detectors 86, 88 and 90 (FIG. 8) with attached electrical conductors 80,92 and 82,94 and 84,96 respectively. An increase of conductance in these detectors occurs when irradiated with the proper wavelengths of IR. The lateral positions of detectors 86, 88 and 90 determine the center of their IR spectral response. The physical widths of detectors 86, 88 and 90 determine their bandwidths. For example, the width of detector 86 may detect wavelengths having lower limits from 3 mm on the left to 4.5 mm on the right and the composition of film 70 immediately opposite to detect 86 may pass wavelengths longer than 2.8 mm on the left and 4.3 mm on the right. Thus, detector 86 may exhibit increases in conductance for only the band of 3 to 4.5 mm. Detector 88 has a similarly tailored response at longer wavelengths with a narrower passband than detector 86. Detector 90 has a very narrow range of IR wavelength response at a longer wavelength than either detectors 86 or 88 which is desirable when detecting carbon dioxide or carbon monoxide components during combustion of organic material in an atmospheric environment.

An advantage of the present invention, a double sided filter/detector device is that a substantial inventory of double sided film material may be prepared in advance. Subsequently the MCT film 64 may be patterned to achieve an -IR response tailored to the application.

Figure 9A:
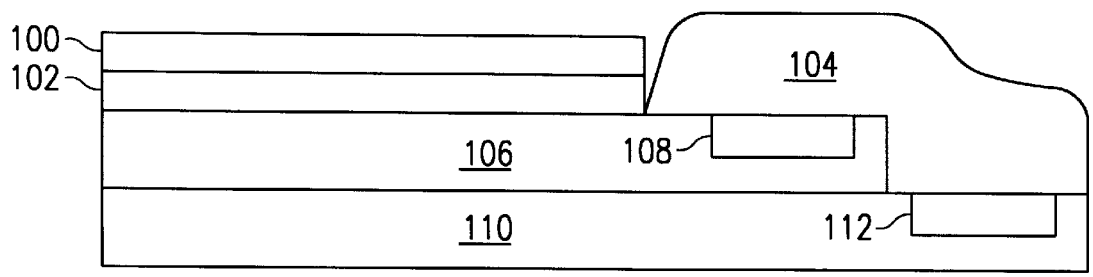
FIG. 9A illustrates the use of GaAs as a lattice match material between MCT and Si to provide a material with active elements to process the signals from MCT detectors.

For system design considerations where the cost permits, it may be desirable to have the MCT filters and detectors on the same substrate with the active devices that process the signals from the detectors. The crystal lattice mismatch between Si and MCT is much too severe to permit either to be grown on the other. (e.g. Si grown on MCT or vice versa) However, FIG. 9 and Table 5 illustrate two methods of manufacturing active devices and MCT filters and detectors on the same substrate. Although only one MCT film is shown, it should be understood that a plurality of MCT films acting as either or both filters and detectors is possible because the MCT growth temperature of around 450° C. will not harm either unbonded GaAs or unbonded Si devices. In FIG. 9A an epitaxially grown film of GaAs 106 is grown on Si substrate 110. Where it is desired to form Si devices in region 112, the GaAs is etched away. Region 112 is fabricated with either or both discrete and integrated Si devices and then covered with a protective layer, such as plasma deposited silicon nitride (not shown) while GaAs devices are created in the GaAs region 108. Both 106 and 110 are covered

TABLE 5

| ID # | Description | Function |
| --- | --- | --- |
| 100 | MCT film layer | To be patterned into IR detectors |
| 102 | CdTe film layer | Lattice match between 100 and 106 permits LPE film growth. |
| 104 | Plasma deposited silicon nitride or silicon oxide protective layer | Prevents damage to regions 108 and 112 which contain active semiconductor devices. |
| 106 | GaAs epitaxial layer | Can be epitaxially grown on Si and can also provide useful devices within 108. |
| 108 | Protected GaAs device region | May contain discrete or integrated circuit devices of GaAs. |
| 110 | Silicon substrate | Provides mechanical support for all epitaxially grown layers and may provide region 112. |
| 112 | Protected Si device region | May contain discrete or integrated circuit devices of Si. |
| 114 | ZnSe epitaxial layer | Provides lattice parameters which allows it to be epitaxially grown on Si and also allows CdTe to be epitaxially grown on it. | with a protective layer 104, such as plasma deposited silicon nitride, during the subsequent LPE growth phase of 102 and 100. CdTe 102 may be grown epitaxially on GaAs 106 and MCT 100 may be grown on 102. Although the variants are numerous, MCT 100 may now be fabricated into detectors having the desired IR wavelength response without harm to the protected circuits 108 and 112. The protective layer 104 may now be selectively removed and interconnecting bonding pads opened such that leads may be attached or deposited between 100, 108 and 112 for the final system configuration.

Figure 9B:
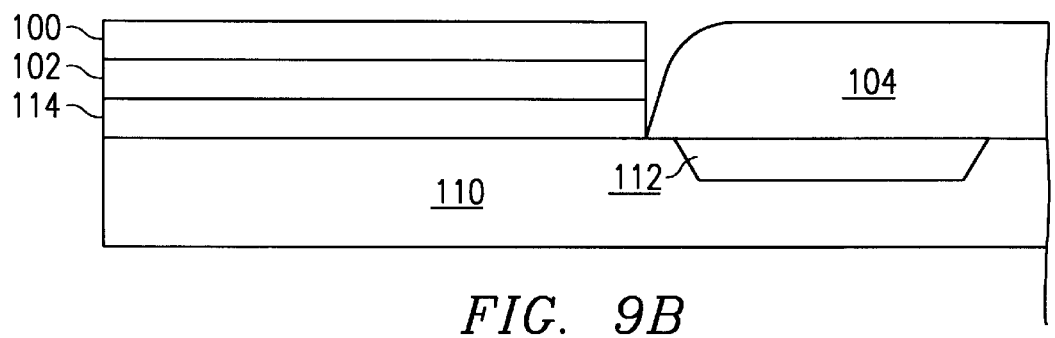
FIG. 9B illustrates the use of zinc selenide (ZnSe) as a lattice match material between MCT and Si to provide a material with active elements to process the signals from MCT detectors.

FIG. 9B shows a similar configuration where only Si devices are required. In this case the Si substrate 110 has silicon devices fabricated in region 112 as before and then covered overall with a protective layer of plasma deposited silicon nitride 104. The exposed area of Si 110 matches the lattice parameters of ZnSe close enough to allow the epitaxial growth of ZnSe film 114. ZnSe also matches the lattice parameters of CdTe close enough to allow the epitaxial growth of CdTe film 102. Now the MCT detector/filter film 100 is grown on 102 and patterned into the desired detector/filter geometries. Layer 104 may be selectively removed to expose the bonding pads of 112 and the such that interconnection leads may be bonded between the Si devices of 112 and the detectors formed from 100.

Figure 9C:
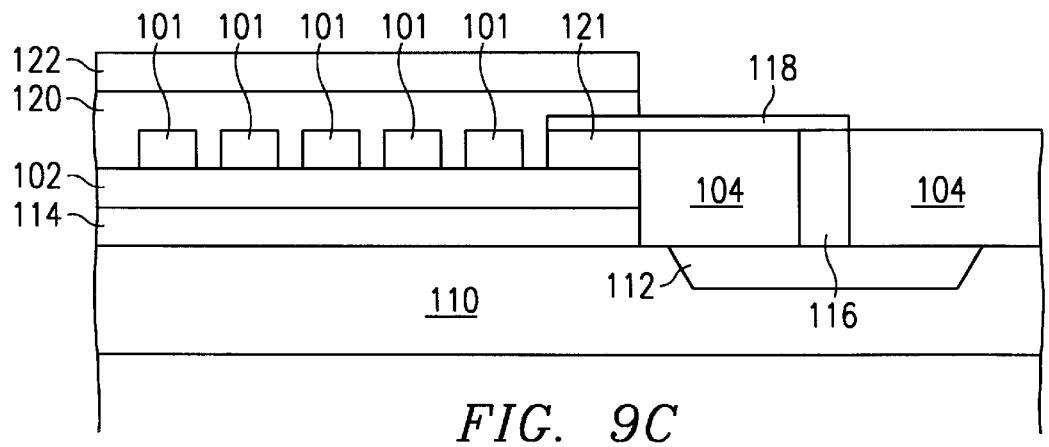
FIG. 9C illustrates the use of a latterly continuously graded HgCdTe filter over MCT detectors.

FIG. 9c shows an integrated device with HgCdTe filter, HgCdTe IR sensors, and silicon circuitry, which can be used, e.g., as a integrated spectrometer. Layer 104 has been selectively removed to form a via to expose the bonding pads of 112. The MCT film 100 (see FIG. 9b) has been patterned (e.g. photolithographically etched) to form MCT detector stripes 101, 121. Via conductor 116 has been formed (e.g. from a metal such as aluminum) in the via and interconnection lead 118 has been used to connect sensor 121 to via conductor 116, thus connecting the Si devices of 112 and the detectors formed from 100. Interconnection lead 118 may be from a metal such as aluminum, but is preferably HgTe, and lead 118 is patterned to cover only a small end portion of sensor 121 and to leave most of the sensor uncovered. A second lead (not shown) can be used to make a second contact at the opposite end of sensor 121. CdTe insulator 120 has been LPE grown between and over the stripes and MCT filter film 122 LPE grown over the CdTe insulator.

Figure 9D:
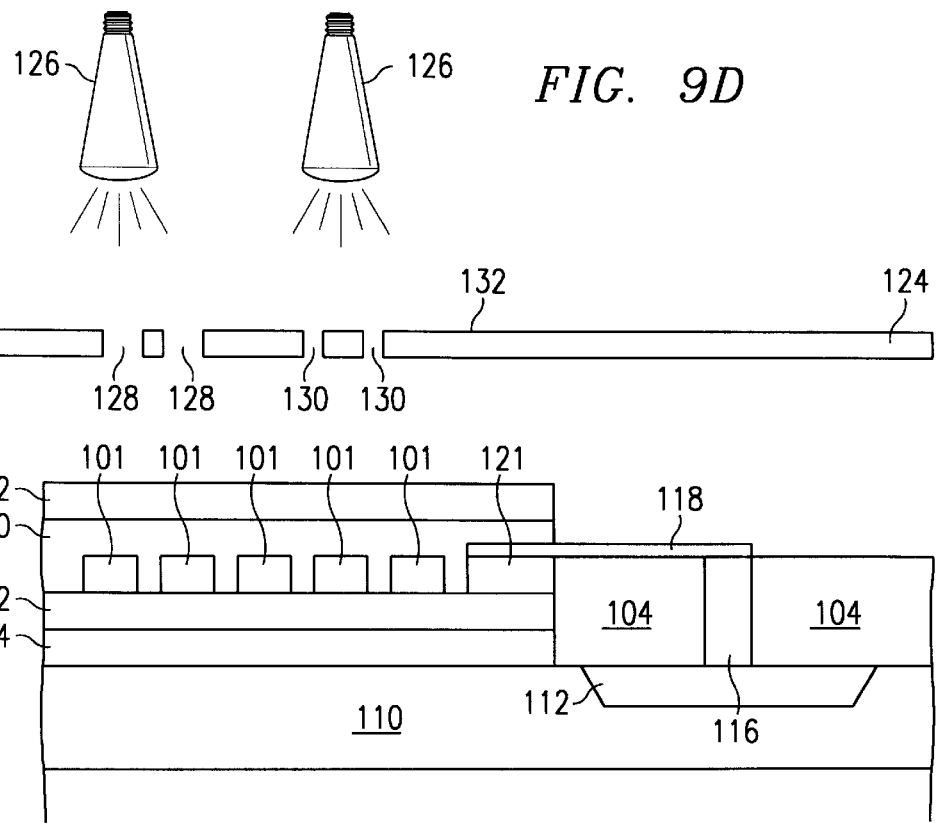
FIGS. 9D–E illustrate rapid thermal annealing lamps used in conjunction with a reflective mask to provide non-uniform heating.

While the filter film could be continuously graded at this point with controlled temperature gradient heater 43 of FIG. 5, FIG. 9d shows an alternate embodiment in which non-uniform MCT filter film 122 is fabricated using a mask 124 and conventional rapid thermal annealing lamps 126. This embodiment can be used in controlled atmosphere containing Hg vapor. The mask contains large openings 128 to provide hotter portions of MCT filter film 122, small openings 130, to provide intermediate temperature portions of MCT filter film 122, and solid portions 132 to provide cooler portions of MCT filter film 122. Preferably a non-contact mask is utilized, and the lamp-mask spacing is not to scale, as the lamps are generally much further away than shown. While rapid thermal annealing lamps have previously been used to provide uniform heating, here the lamps are used in conjunction with a reflective mask to provide non-uniform heating. Note that while the mask is shown with holes, it could also be a patterned reflective coating on a transparent substrate. Note also such lamps can also be used in conjunction with a mask to provide non-uniform heating to MCT film 100 (see FIG. 9b) prior to the application of CdTe insulator 120, either before or after film 100 has been patterned to form MCT detector stripes (stripes 101, 121 as shown in FIG. 9c). Such non-uniform heating of film 100 or stripes 101, 121 can provide for MCT detectors having different spectral responses.

Figure 9E:
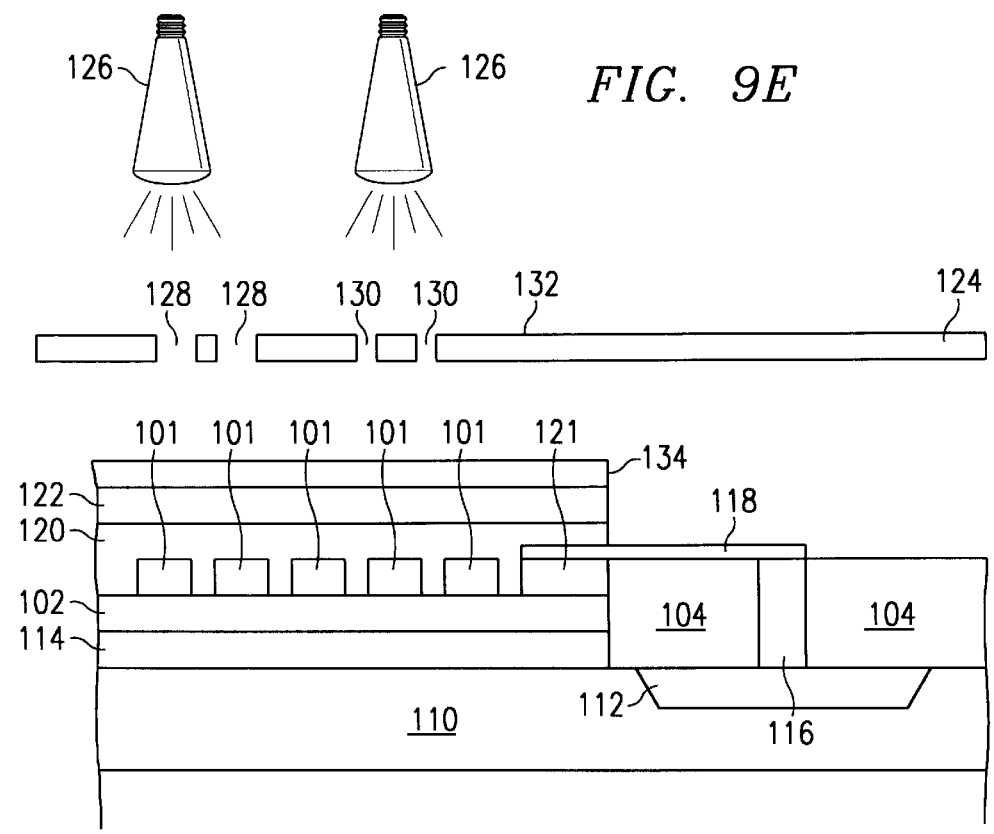

FIG. 9e shows and alternate embodiment in which a controlled atmosphere containing Hg vapor is not used. Instead, the structure of FIG. 9c has been modified by adding a HgTe layer 132 over the MCT filter film 122. Again, non-uniform MCT filter film 122 is fabricated using mask 124 and conventional rapid thermal annealing lamps 126. Generally the HgTe layer is removed after the heating. This embodiment can be used to provide an integrated IR detector assembly with a continuously graded HgCdTe filter layer without the use of a controlled atmosphere containing Hg vapor.

While this invention has been described with reference to illustrative embodiments, this description is not intended to be construed in a limiting sense. For illustrative purposes, specifically tuned sensors and geometric arrangements have been chosen for clarity without in any way intending that these examples limit the generic application of MCT IR detectors operated at either uncooled or cooled temperatures to detect IR for analytic or control purposes. As used herein, the term "uncooled" includes ambient temperature usage as well as temperatures controlled within 20 degrees C. of ambient. The example applications are intended as prototypical and not limited to those included. Many more detectors than shown can be placed on the same substrate.

An analytic instrument such as an IR spectroscope would contain numerous MOT detectors of variously tuned wavelengths. Non-uniform heating could e.g., also be provided by a scanning laser. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of fabricating a continuously graded HgCdTe layer said method comprising:
   a) growing a laterally continuous HgCdTe film with a constant ratio of Hg to Cd;
   b) laterally, non-uniformly, heating said film to change the ratio of Hg to Cd in said film thereby creating a continuously graded HgCdTe layer.

2. The method of claim 1, wherein said heating is in a controlled atmosphere.

3. The method of claim 1, wherein said HgCdTe film is between a Cd-rich layer and a Hg-rich layer.

4. The method of claim 3, wherein said Cd-rich layer is CdTe and said Hg-rich layer is HgTe.

5. The method of claim 3, wherein said Hg-rich layer is removed after said heating.

6. The method of claim 2, wherein said film has a hotter portion and a cooler portion during said heating, and said controlled atmosphere contains Hg vapor such that said controlled atmosphere is saturated in said Hg vapor adjacent said film cooler portion.

7. The method of claim 6, wherein said film is adjacent a Cd-rich substrate and after said heating, said ratio of Hg to Cd is higher in said film cooler portion than said ratio of Hg to Cd in said film hotter portion.

8. The method of claim 1, wherein said film is of essentially constant thickness.

9. The method of claim 2, wherein said film has a hotter portion and a cooler portion during said heating, and said controlled atmosphere contains Hg vapor such that said controlled atmosphere is saturated in said Hg vapor adjacent said film hotter portion.

10. The method of claim 9, wherein said film is adjacent a Cd-poor substrate and after said heating, said ratio of Hg to Cd is lower in said film cooler portion than said ratio of Hg to Cd in said film hotter portion.

11. The method of claim 1, wherein said film is adjacent a Cd-rich insulating substrate.

12. The method of claim 1, wherein said film is adjacent a Cd-poor substrate.

13. The method of claim 11, wherein said Cd-rich substrate is CdTe.

14. The method of claim 13, wherein said CdTe substrate has a top side and a bottom side, wherein said HgCdTe layer is on the top side of said substrate, and wherein a HgCdTe detector layer is on the bottom side of said substrate.

15. The method of claim 14, wherein said HgCdTe film, said CdTe substrate, and said HgCdTe detector layer are grown sequentially by liquid phase epitaxy.

16. The method of claim 15, wherein said CdTe substrate is grown on said HgCdTe film, and said HgCdTe detector layer is grown on said CdTe substrate.

17. The method of claim 16, wherein said HgCdTe detector layer is etched to provide at least two HgCdTe sensors and said continuously graded HgCdTe layer is used as a HgCdTe filter for said at least two HgCdTe sensors to provide an integral IR sensing assembly.

18. The method of claim 1, wherein said film has a hotter portion and a cooler portion, and wherein said heating is in a controlled atmosphere which contains Hg vapor.

19. The method of claim 18, wherein said film is adjacent a Cd-rich substrate and after said heating, said ratio of Hg to Cd is higher in said film cooler portion than said ratio of Hg to Cd in said film hotter portion.

20. The method of claim 18, wherein said film is adjacent a Cd-poor substrate and after said heating, said ratio of Hg to Cd is lower in said film cooler portion than said ratio of Hg to Cd in said film hotter portion.

21. The method of claim 1, wherein said non-uniform heating is by rapid thermal annealing lamps used in conjunction with a reflective mask.

22. The method of claim 14, wherein said heating also causes said HgCdTe detector layer to be continuously graded, and wherein said HgCdTe detector layer is etched to form at least two HgCdTe sensors.

23. A method of fabricating a continuously graded HgCdTe layer, said method comprising:
   growing an HgCdTe film which is continuous in a lateral direction, which has a dimension in said lateral direction that is substantially greater than a thickness of said film in a direction perpendicular to said lateral direction, and which has a constant ratio of Hg to Cd therealong in said lateral direction; and
   non-uniformly heating said film along said lateral direction to change the ratio of Hg to Cd in said film so that the ratio is continuously graded in said lateral direction.

* * * * *

UNITED STATES PATENT AND TRADEMARK OFFICE
CERTIFICATE OF CORRECTION

PATENT NO. : 6,036,770
DATED : March 14, 2000
INVENTOR(S) : Dipankar Chandra, et al It is certified that error appears in the above-identified patent and that said Letters Patent is hereby corrected as shown below:

Column 3, line 62, after "of", delete "MOT", and insert --MCT--.

Column 3, line 64, after "the", delete "MOT", and insert --MCT--.

Column 4, line 7, after "of", delete "MOT", and insert --MCT--.

Column 4, line 9, after "after", delete "MOT", and insert --MCT--.

Column 4, line 13, after "inhibit", delete "MOT", and insert --MCT--.

Column 4, line 15, after "of", delete "MOT", and insert --MCT--.

Column 5, line 36, after "during", delete "ring".

Column 6, line 64, after "over", delete "MOT", and insert --MCT--.

Column 7, line 5, after "for", delete "Fig", and insert --Figs--.

Column 11, line 2, after "numerous", delete "MOT", and insert --MCT--.

Signed and Sealed this

Twenty-fourth Day of April, 2001

Attest:

NICHOLAS P. GODICI

Attesting Officer

Acting Director of the United States Patent and Trademark Office